United States Patent
Lang et al.

(10) Patent No.: US 9,799,599 B2
(45) Date of Patent: Oct. 24, 2017

(54) MATCHING TECHNIQUES FOR WIDE-BANDGAP POWER TRANSISTORS

(75) Inventors: Richard John Lang, Leeds (GB);
Richard Paul Hilton, Leeds (GB);
Jonathan David Stanley Gill, Bradford (GB)

(73) Assignee: Diamond Microwave Devices Limited, Leeds, Yorkshire (GB)

( * ) Notice: Subject to any disclaimer, the term of this patent is extended or adjusted under 35 U.S.C. 154(b) by 0 days.

(21) Appl. No.: 14/110,426

(22) PCT Filed: Apr. 4, 2012

(86) PCT No.: PCT/EP2012/056202
§ 371 (c)(1),
(2), (4) Date: Dec. 16, 2013

(87) PCT Pub. No.: WO2012/136719
PCT Pub. Date: Oct. 11, 2012

(65) Prior Publication Data
US 2015/0041914 A1    Feb. 12, 2015

(30) Foreign Application Priority Data

Apr. 7, 2011   (GB) .................... 1105912.8

(51) Int. Cl.
*H01L 27/00* (2006.01)
*H01L 23/522* (2006.01)
(Continued)

(52) U.S. Cl.
CPC ...... *H01L 23/5223* (2013.01); *H01L 23/5227* (2013.01); *H01L 23/642* (2013.01);
(Continued)

(58) Field of Classification Search
CPC ............ H01L 2924/3011; H01L 23/66; H01L 2223/6655; H01L 2223/6627;
(Continued)

(56) References Cited

U.S. PATENT DOCUMENTS 4,168,507 A * 9/1979 Yester, Jr. ........... H01L 23/5383
257/531
5,132,641 A * 7/1992 Khandavalli ........... H03F 3/602
330/277
(Continued)

FOREIGN PATENT DOCUMENTS

GB        2381668 A      5/2003
JP      H04159732 A      6/1992
(Continued)

OTHER PUBLICATIONS

Whitaker, J. "The Electronics handbook", p. 1085, CRC Press, 1996.*
(Continued)

*Primary Examiner* — Sitaramarao S Yechuri
(74) *Attorney, Agent, or Firm* — Reising Ethington P.C.

(57) ABSTRACT

There are disclosed impedance matching networks and technique for impedance matching to microwave power transistors. Distributed capacitor inductor networks are used so as to provide a high degree of control and accuracy, especially in terms of inductance values, in comparison to existing lumped capacitor arrangements. The use of bond wires is reduced, with inductance being provided primarily by microstrip transmission lines on the capacitors.

23 Claims, 3 Drawing Sheets

(51) Int. Cl.
*H01L 23/64* (2006.01)
*H01L 23/66* (2006.01)
*H03F 1/56* (2006.01)
*H03F 3/60* (2006.01)
*H01L 27/06* (2006.01)

(52) U.S. Cl.
CPC .......... H01L 23/66 (2013.01); H01L 27/0629 (2013.01); H03F 1/56 (2013.01); H03F 3/60 (2013.01); *H01L 2223/6611* (2013.01); *H01L 2223/6627* (2013.01); *H01L 2223/6655* (2013.01); *H01L 2224/45124* (2013.01); *H01L 2224/48091* (2013.01); *H01L 2224/48137* (2013.01); *H01L 2924/1423* (2013.01); *H01L 2924/3011* (2013.01); *H01L 2924/30107* (2013.01); *H01L 2924/30111* (2013.01); *H03F 2200/222* (2013.01); *H03F 2200/387* (2013.01)

(58) Field of Classification Search
CPC ............ H01L 2223/6683; H03F 1/56; H03F 2200/222; H03F 2200/387; H03F 3/60; H03F 2200/255; H03F 2200/423; H03H 7/38; H01P 5/12
USPC .......................................................... 257/379
See application file for complete search history.

(56) References Cited

U.S. PATENT DOCUMENTS

| | | | | |
|---|---|---|---|---|
| 5,162,756 | A * | 11/1992 | Taniguchi | H03F 3/604 330/295 |
| 5,363,060 | A | 11/1994 | Kohno | |
| 5,387,888 | A | 2/1995 | Eda et al. | |
| 5,576,661 | A | 11/1996 | Kumagai | |
| 5,942,957 | A | 8/1999 | Mohwinkel et al. | |
| 5,973,567 | A * | 10/1999 | Heal | H01L 23/66 330/277 |
| 6,023,080 | A * | 2/2000 | Kojima | H01L 23/66 257/275 |
| 6,529,081 | B1 | 3/2003 | Macheel et al. | |
| 6,741,144 | B2 * | 5/2004 | Maeda | H01L 23/66 330/84 |
| 7,911,271 | B1 | 3/2011 | Jia | |
| 8,508,318 | B2 | 8/2013 | Iwanami | |
| 8,542,077 | B2 | 9/2013 | Masuda | |
| 2002/0041009 | A1 | 4/2002 | Yamaguchi | |
| 2002/0186091 | A1 | 12/2002 | Maeda et al. | |
| 2003/0141587 | A1 * | 7/2003 | Frey | H01L 23/66 257/723 |
| 2006/0035404 | A1 * | 2/2006 | Saunders | G06F 17/5068 438/100 |
| 2006/0066416 | A1 * | 3/2006 | Nicholson | H01L 23/04 333/32 |
| 2007/0268073 | A1 | 11/2007 | Suzaki et al. | |
| 2009/0256266 | A1 * | 10/2009 | Lao | H01L 23/642 257/774 |
| 2010/0140721 | A1 * | 6/2010 | Takagi | H01L 23/66 257/401 |
| 2010/0237967 | A1 | 9/2010 | Ueno | |
| 2011/0204976 | A1 * | 8/2011 | Masuda | H01L 23/047 330/195 |
| 2013/0001662 | A1 | 1/2013 | Nishijima | |

FOREIGN PATENT DOCUMENTS

| | | |
|---|---|---|
| JP | 2001320252 A | 11/2001 |
| JP | 2002335136 A | 11/2002 |
| JP | 2010226487 A | 10/2010 |
| WO | WO2011111130 A1 | 9/2011 |

OTHER PUBLICATIONS

Combined International Search Report and Examination Report for corresponding application No. GB1105912.8, Aug. 11, 2011, 5 pages.
Combined International Search Report and Examination Report for application No. GB 1206045.5, dated Aug. 3, 2012, 3 pages.
International Search Report for PCT Application No. PCT/EP2012/056202, dated Sep. 3, 2012, 4 pages.
Great Britian Search & Examination Report for application No. GB1323159.2, dated Jul. 31, 2014, 8 pages.

* cited by examiner

MATCHING TECHNIQUES FOR WIDE-BANDGAP POWER TRANSISTORS

The present application is directed towards the use of distributed capacitance and arrays thereof in the pre- and post-matching of discrete microwave power transistors to improve power amplifier performance.

BACKGROUND

Microwave power amplifiers using discrete (unpackaged) wide bandgap transistors can be realised in a hybrid arrangement, either using a single transistor or using several such transistors combined (in parallel) and assembled with specific separate passive electronic components to achieve a prescribed level of performance. This hybrid microwave integrated circuit (MIC) realisation is often preferred to an integrated solution (such as a microwave monolithic integrated circuit or MMIC), as it can lead to much improved performance through the use of higher "Q" external embedding electronic components. A requirement of the MIC arrangement is that the discrete transistors are connected to input and output matching networks or components through the use of many bond wires. The output of each transistor comprises a large number of intrinsic parallel feeds, and therefore has low impedance (when compared with a low-power transistor), while the input comprises a large number of gates, and therefore has relatively high capacitance (when compared with a low-power transistor). It can therefore be difficult to provide a suitable impedance match between the transistor and its embedding circuits which provides good power transfer across a required band of frequencies. Such a match requires the application of prescribed inductive and capacitive reactances.

Bond wires in MIC devices are used to connect together individual discrete components and are typically short lengths (say 50-500 µm) of thin (say 25 µm diameter), high-conductivity (often gold or aluminium) wires that are assembled using conventional wire-bonding equipment. These bond wires have an inductive reactance that increases with operating frequency ($X_L=\omega L$, where $X_L$ is the inductive reactance, $\omega$ is the frequency and L is the length of the bond wire) and which is critically dependent upon the length and orientation of the wire.

This, however, results in a problem: designs which use bond wires to form part of the inductance of an impedance transformation are susceptible to performance variation from bond wire manufacturing production tolerance. In particular, the inductance provided by a bond wire is critically determined by its length and shape, and even slight variations in bond wire length or orientation can lead to changes in inductance, especially at high frequencies. For example, variations in bond wire length that may not present a particular problem at 2 GHz become rather more problematic at 20 GHz, where its reactance is a factor of 10 higher for the same length of wire.

The bond wire inductance, being part of the overall hybrid amplifier circuit, needs to be accurately controlled to ensure repeatable and high-yielding circuit performance. Some consistency and control may be achieved through the use of automated wire bonding techniques, but this is not always possible for low-volume production runs, and the wire lengths are still subject to a specific manufacturing tolerance.

The main problem therefore is how to overcome the inherent performance variation (and consequent limitation on manufacturing yield) from an MIC power amplifier which uses bond wires with potentially randomly or systemic varying dimensions within the important embedding matching networks. In other words, how to reduce significantly the sensitivity of the performance of such an amplifier to manufacturing variations in the bond wires used in the amplifier matching networks.

In addition to this main problem, there is a need to implement matching networks that can accommodate the low output impedance and high input reactance of wide bandgap transistors (although the same problem can also exist with other conventional FET devices). This can be achieved through the use of external "lumped" shunt capacitive matching elements (chip capacitors) as impedance transformers, but these require close attention to the effect of extrinsic bond wire inductance. An example of such a matching network is known from EP2197030, which discloses a high frequency semiconductor device taking the form of a field effect transistor (FET) with multiple parallel inputs and multiple parallel outputs, each realised by a plurality of bond wires.

Another problem is that lumped designs which use separate inductors (bond wires) and chip capacitors to implement an impedance transformation have an inherent bandwidth limitation when compared with the use of a distributed network, unless the number of capacitive and inductive stages is increased.

BRIEF SUMMARY OF THE DISCLOSURE

Viewed from one aspect, there is provided an intermediate impedance transforming device for a microwave power transistor, the device comprising: a dielectric substrate bearing or containing a plurality of elongate microwave transmission lines each having a length and extending across or through the substrate, the microwave transmission lines each having a first end and a second end, a predetermined series inductance per unit length and, in combination with an electrically isolated conductive plate or layer, a predetermined shunt capacitance per unit length, such that each length of microwave transmission line together with the conductive plate or layer has a predetermined characteristic impedance and phase constant; the device being configured such that, when a bond wire of a specified minimum practical length with an associated impedance is connected between an end of one of the microwave transmission lines and a microwave power transistor, the impedance of the bond wire is absorbed into the impedance per unit length of the microwave transmission line.

Viewed from another aspect, there is provided an impedance transforming arrangement comprising a microwave power transistor formed on a first dielectric substrate having a first dielectric constant, and at least one intermediate impedance transforming device of the previous aspect.

Viewed from another aspect, there is provided an impedance transforming arrangement in combination with a microwave power transistor, the impedance transforming arrangement comprising a matching network formed on a first dielectric substrate having a first dielectric constant, and at least one intermediate impedance transforming device.

Viewed from yet another aspect, the present invention provides a method of impedance matching to a microwave power transistor, wherein a plurality of microwave transmission lines are connected by bond wires each having an impedance to a gate or drain terminals of the transistor, the microwave transmission lines extending across or through a dielectric substrate, the microwave transmission line having a predetermined series inductance and, in combination with an electrically isolated conductive plate or layer, a predetermined shunt capacitance such that each microwave transmission line together with the conductive plate or layer has a predetermined characteristic impedance and phase contrast, and wherein the impedance of each bond wire is absorbed into the impedance of the microwave transmission line to which it is connected.

In typical embodiments, the impedance matching device comprises an array of microwave transmission lines arranged side-by-side in parallel formation. Each line may have the potential to affect its neighbouring line or lines by electromagnetic coupling and may therefore modify its effective capacitance or inductance per unit length. The array may be provided on the gate side of the transistor or the drain side of the transistor, or two arrays may be provided, one on each side of the transistor for pre- and post-matching. Each array may be formed on one piece of dielectric substrate, or several arrays each on a separate piece of dielectric substrate may be provided on one or other or both sides of the transistor. The device may be manufactured as a single part (for each side of the transistor), or several identical parts could be deployed in side-by-side formation.

An impedance transforming device, comprising distributed inductance and capacitance, may be seen or configured as an array of bar capacitors, typically taking the form of a rectangular dielectric substrate having first and second substantially parallel major surfaces, with metallization on the first and second surfaces to form the plates of the capacitor. The metallization on one surface may be over substantially the whole surface, while the metallization on the other opposed surface may take the form of a microwave transmission line such as a conductive microstrip transmission line, a coplanar waveguide or a conductive strip line transmission line. The overall shape may be bar shaped (long, flat and thin), hence the name bar capacitor. The microwave transmission line or lines typically extend along substantially the whole length of the rectangular dielectric substrate.

A particular advantage of a device of this type is that the microwave transmission line incorporates inductance, as well as providing a capacitance against the opposing metallised surface on the other side of the dielectric substrate. By carefully selecting the width and length of the microwave transmission line, along with its spacing from the opposed metallised surface and the dielectric constant of the dielectric material, it is possible to form an impedance matching component with well-defined inductance and capacitance per unit length (or impedance). Because the length of the microwave transmission line, which primarily defines the inductance, is well-defined (since it runs from one end of the dielectric substrate to the other), the inductance is well-defined. Moreover, by performing the impedance matching primarily in the bar capacitor array, rather than in external, "lumped" shunt capacitors, the lengths of any extrinsic bond wires are significantly reduced. Indeed, the minimum length required to join the distributed or bar capacitor to the transistor would normally be employed, and this finite bond wire inductance would be absorbed into the matching network. This means that slight variations in the lengths and attachment points of the extrinsic bond wires are minor compared to the overall inductance as provided by the bar capacitor array (the major part of this being the microstrip transmission lines).

Another advantage is that the dielectric substrate of the device may be made of a material with a higher dielectric constant than that of generic PCB substrates such as FR4 or Duroid® or the like. For example, in a monolithic environment such as an MMIC using GaAs, the dielectric constant of the monolithic substrate is around 12.9. The device of present embodiments can be made with high dielectric constant substrates having a dielectric constant higher than 12.9, for example 13, 20, 30, 40 or higher, and in some variants less than 300.

Certain embodiments of the device may be viewed in terms of a (short) length of transmission line utilising a material with a high dielectric constant (high with respect to that which would normally be used if a monolithic environment was used—as in an MMIC for instance). The device in effect replaces a lumped capacitor with a finite length of a "microstrip" transmission-line, which in its simplest form can be modelled as a serial cascade of unit elements which take the form of a series inductor and a shunt capacitor. It is also possible that a "coplanar waveguide" or other similar transmission line type could be employed. In essence, the total line capacitance replaces the lumped capacitance, but the added benefit is that the additional "distributed" inductance can be used in the matching solution. In fact the impedance of a transmission line, defined as the square root of the inductance per unit length divided by the capacitance per unit length, and this is also used in the matching solution. The use of a separate, or "discrete" transmission line in this way, with a substrate of high dielectric constant (say 13, 40 or higher, although in some embodiments not exceeding 300), allows the use of a higher capacitance per unit length than would be achievable on a planar integrated circuit (say with a dielectric constant of 12.9 for GaAs) and leads to a more compact and more versatile impedance transforming network.

In some embodiments, one major surface of a dielectric substrate is completely or substantially wholly metallised, while the opposed major surface is provided with an array of parallel metallised tracks in the form of microwave transmission lines.

It is difficult, if not impossible, to avoid coupling between adjacent microwave transmission strips, but it is relatively straightforward to compensate therefor if the amount of coupling can be reliably determined. Since the microwave transmission strips can be printed or photolithographically etched or otherwise formed on the dielectric substrate using high-precision techniques so as to be evenly and regularly spaced, the coupling is predictable. This is in contrast to an array of individually located bond wires that may not be so evenly or regularly spaced.

Certain embodiments seek to absorb the inherent and necessary bond wire inductances (as connected to the gate and drain connections on a microwave power transistor) into a custom, high dielectric constant, capacitor array in either (or both) of the pre- and post-matching networks of discrete microwave wide-bandgap power transistors.

A bar capacitor array (FIG. 2), in contrast to a lumped capacitor and pair of bond-wires (FIG. 1), effectively "absorbs" the required matching inductance and reduces significantly the amount of inductance that is required in the wire bond—the latter being susceptible to manufacturing variances and tolerances. The bar capacitor array can be manufactured using precise photolithographic techniques, and is very repeatable (or can be selected to have a prescribed small tolerance) and reduces the reliance on high-tolerance manufacturing of the more difficult bond wire approach.

The bar capacitor array can also utilise a wide range of high-dielectric constant material, to allow a designer to seek to optimise the matching impedance. Additionally, by utilising a printed or etched "array" of capacitors on a single substrate, the input and output connections to the multiple gate and drain connections of the power can also be better controlled—which includes the reactance as applied to each device terminal, and also the electromagnetic coupling between capacitive elements (which would normally be separately assembled).

The overall effect of utilising a distributed or bar capacitor array in this manner is to improve the performance and manufacturing yield of a microwave power amplifier when compared with a conventional lumped-element or discrete chip realisation.

This technique is expected to increase the manufacturing yield of such amplifiers, leading to a reduction in manufacturing cost of the finished product. Additionally, this technique is expected also to improve the overall bandwidth performance when compared with more conventional lumped element matching techniques.

An additional advantage of certain embodiments is that it is easy to assemble a matching network with reliable and reproducible matching properties by simply aligning proximal ends of the bar capacitor array close to the edges of the microwave power transistor when mounting on a circuit board substrate. This can be done on both the gate and the drain sides of the microwave power transistor, and further reduces the margin for error due to inconsistent bond-wire lengths. By aligning proximal ends of the bar capacitor array close to the edges of the transistor before connecting to the drain or gate terminals of the microwave transistor, correct orientation of the microwave transmission lines is facilitated, and only short pieces of bond wire need to be used to connect the microstrip transmission lines to the respecting transistor terminals. Indeed, since the distance between the end of each microstrip transmission line and its respective transistor terminal is more or less the same, identical lengths of bond wire can be used. In some embodiments, it may be possible to abut the proximal ends of the bar capacitor arrays to the edges of the microwave transistor, but most often there will be a small gap due to the methods used for placing and affixing the components onto a circuit board or other substrate. In particular, the use of epoxies or solders and die handling collets may make it difficult to abut the proximal ends of the bar capacitor arrays so that they actually touch the edges of the transistor component.

In some embodiments, the intermediate impedance transforming devices may be mounted upside down in a "flip-chip" manner between a power transistor and external embedding networks, with the power transistor and the external networks being fabricated on the same dielectric substrate (for instance as in a monolithic integrated circuit). In such an arrangement, the extrinsic bond wires may be replaced with "solder bumps", conductive epoxy or preformed conductive tracks or a similar attachment method, and attachment to the ground plane of the device could be by conductive via connections within the device or by a "wrap-around" connection on the edge of the device.

In summary, embodiments of the present application work by absorbing or making negligible the inductance of any necessary bond wires into a well-defined series inductance of a precisely manufactured microwave transmission line on a dielectric substrate, and by provided a shunt capacitance to this series inductance by way of an opposed plate or metallization. Improved capacitance per unit length is obtained by using a dielectric substrate with a high dielectric constant, higher than that of substrates typically used in MMIC and MIC implementations. In this way, improved impedance matching to a microwave power transistor is facilitated.

BRIEF DESCRIPTION OF THE DRAWINGS

Embodiments of the invention are further described hereinafter with reference to the accompanying drawings, in which.

DETAILED DESCRIPTION

Figure 1:
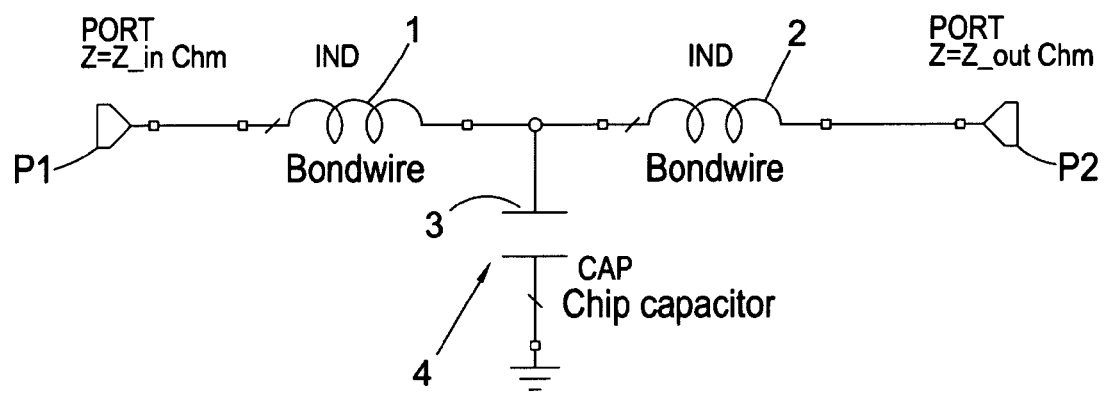
FIG. 1 is a schematic diagram showing a prior art lumped chip capacitor and extrinsic bond wire arrangement.

FIG. 1 shows a known impedance transforming arrangement between two ports P1 and P2. The port P1 could represent an external circuit of impedance Z1 and the port P2 could represent the impedance as presented by a power transistor. This arrangement is similar to the impedance transforming arrangement disclosed in EP2197030. Two inductors in the form of bond wires 1, 2 connect a discrete or lumped capacitor 4 to, respectively, the external matching network and the power transistor. The first bond wire 1 connects the port P1 to one plate 3 of the lumped capacitor 4 and the second bond wire 2 which connects plate 3 of the lumped capacitor 4 to the port P2. Bond wires 1 and 5 are each configured as inductors. By selecting appropriate inductance and capacitance properties, the impedances at ports P1 and P2 can be matched to each other for a given signal frequency. However, the inductance of each of the bond wires 1, 2 is primarily dependent on the length and configuration of each bond wire and, to some extent, its spatial orientation. These are difficult to control to desired tolerances when attaching bond wires manually under a microscope. Even when using automated bond wiring machines, it is difficult to achieve a sufficiently high degree of repeatability so as to obtain the best possible tolerances.

Figure 2:
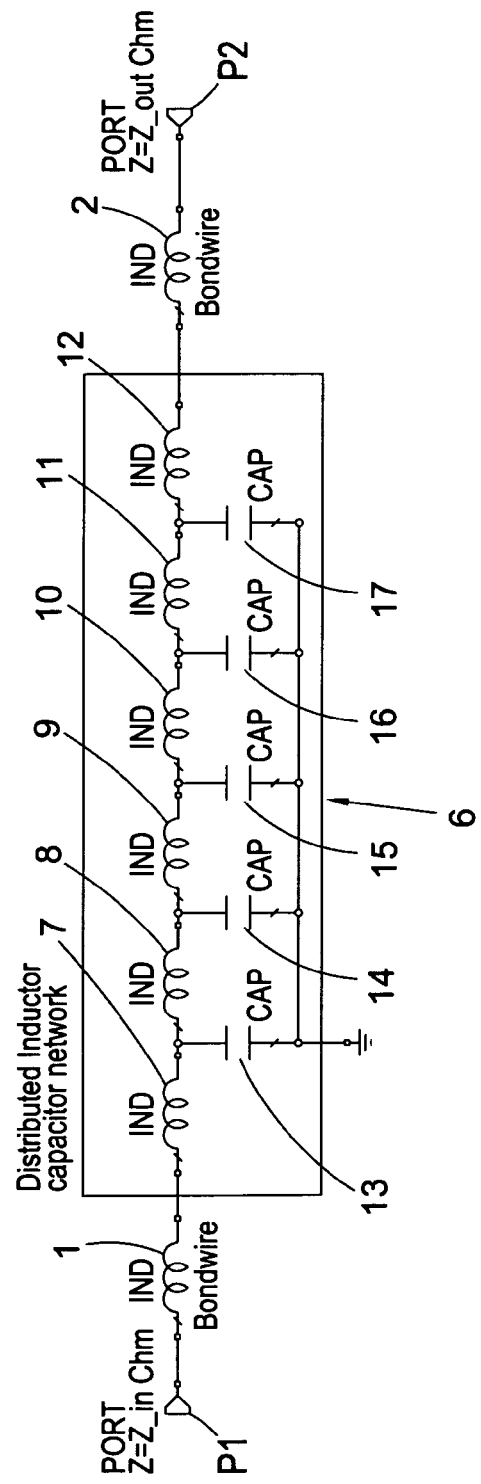
FIG. 2 is a schematic diagram showing a distributed inductor capacitor network of a current embodiment.

FIG. 2 shows, in schematic form, an embodiment of the present application. Here, instead of a lumped capacitor 4 as shown in FIG. 1, a distributed capacitor inductor network or device 6 is utilised. The device 6 is shown in schematic form, and is equivalent to a series of well-defined inductors 7, 8, 9, 10, 11, 12 with interposed parallel capacitive connections 13, 14, 15, 16, 17 to ground. In actual construction terms, the device 6 comprises an oblong slab of dielectric material 18 as a substrate, with a metallised underside as a groundplane, and a microwave transmission line printed or etched or otherwise formed on the opposed topside, the microwave transmission line acting as the series inductors. The ports P1 and P2 are still connected to the ends of the microwave transmission line by bond wires 1, 2, but these bond wires 1, 2 then form only a small part of the overall series of inductors, and any variance in the inductance of the bond wires 1, 2 has a correspondingly minor effect on the overall inductance of the device 6 as a whole.

Figure 3:
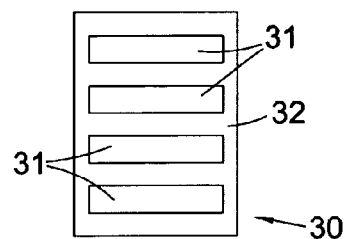
FIG. 3 is a schematic diagram of a bar capacitor array of a further embodiment.

FIG. 3 shows an embodiment of the present application comprising a 1×4 array 30 of generally parallel highly conductive capacitor strips 31 (for example, microstrip transmission lines) printed or etched onto a top surface of a rectangular slab 32 of a dielectric substrate with a high dielectric constant (for example a dielectric ceramic material). The underside of the slab 32 is coated with a highly conductive groundplane (not shown).

Figure 4:
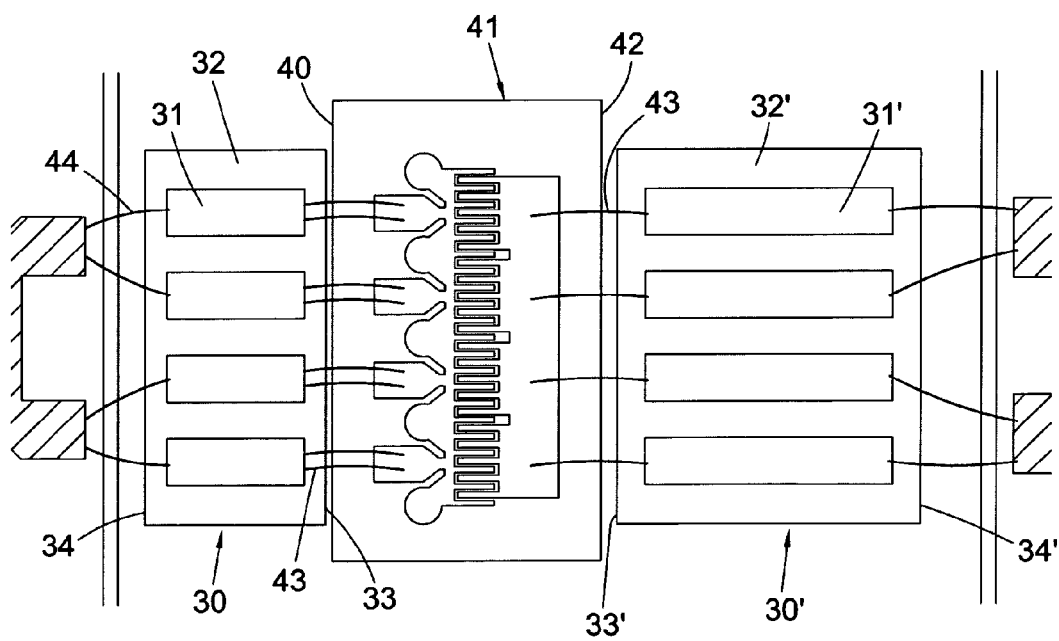
FIG. 4 is a schematic diagram of a bar capacitor array matching network and power transistor of a current embodiment.

FIG. 4 shows an embodiment of the present application using a first 1×4 array 30 of the type illustrated in FIG. 2 on the input side 40 of a microwave power transistor 41, and another 1×4 array 30' on the output side 42 of the transistor 41. Proximal ends 33, 33' of each array 30, 30' are aligned with the edges of the transistor 41 so that only short lengths of extrinsic bond wires 43 are needed to connect each capacitor strip 31, 31' to its associated terminal on the transistor 41. The distal ends 34, 34' of each array 30, 30' face the respective network patterns on either side of the transistor 41 that are standard in microwave power transistor arrangements, and are connected thereto with relatively short lengths of bond wire 44.

Although the embodiment of FIG. 4 shows each array 30, 30' with the capacitor strips (microstrip transmission lines) 31, 31' uppermost on the exposed face of their respective dielectric substrates 32, 32', it is possible in an alternative embodiment to mount the arrays 30, 30' upside down. In such an arrangement, known in the industry as a "flip chip" arrangement, it may be possible to dispense with the bond wires completely and rely on solder bumps, conducting epoxy and/or preformed conductive tracks to form the electrical connections from the matching network through the arrays 30, 30' and to the transistor 41.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. An impedance transforming arrangement comprising a microwave power transistor and at least one intermediate impedance transforming device, the at least one intermediate impedance transforming device comprising:

at least one dielectric substrate having an array of elongate microwave transmission lines that each have a length, the microwave transmission lines extending across or through the at least one dielectric substrate, the microwave transmission lines each having a first end coupled to the microwave power transistor and a second end to be connected to a primary matching network including a dielectric substrate having a dielectric constant, a predetermined series inductance per unit length and, in combination with an electrically isolated conductive plate or layer, a predetermined shunt capacitance per unit length, such that the length of the microwave transmission lines together with the conductive plate or layer has a predetermined characteristic impedance and phase constant, the lines being arranged to transform the impedance between the transistor and the primary matching network, wherein the at least one impedance-transforming device includes a plurality of the microwave transmission lines formed as evenly and regularly-spaced conductive lines, extending along substantially the whole length of the at least one dielectric substrate and aligned with, and connected to, individual terminals of Field Effect Transistors (FETs).

2. An arrangement as claimed in claim 1, wherein the at least one dielectric substrate has a dielectric constant greater than 13.

3. An arrangement as claimed in claim 1, wherein each microwave transmission line is a conductive microstrip transmission line.

4. An arrangement as claimed in claim 1, wherein each microwave transmission line is a coplanar waveguide.

5. An arrangement as claimed in claim 1, wherein each microwave transmission line is a conductive strip line transmission line.

6. An arrangement as claimed in claim 1, the at least one intermediate impedance transforming device comprising a generally oblong slab of dielectric substrate with a first and second opposed major surfaces, the first surface being metalized and the second surface bearing at least one microwave transmission line extending thereacross.

7. An arrangement as claimed in claim 1, wherein one of said at least one dielectric substrate is provided with a plurality of substantially parallel microwave transmission lines extending thereacross or therethrough.

8. An arrangement as claimed in claim 7, wherein each microwave transmission line gives rise to the same predetermined characteristic impedance and phase constant.

9. An arrangement as claimed in claim 7, wherein the microwave transmission lines are configured so as to give rise to different predetermined characteristic impedances and phase constants.

10. An arrangement as claimed in claim 1, wherein the microwave power transistor is provided on a first dielectric substrate having a first dielectric constant, the at least one dielectric substrate of the impedance transforming device having a dielectric constant greater than the first dielectric constant.

11. An arrangement as claimed in claim 1, wherein the at least one intermediate impedance transforming device is part of an array of such devices.

12. An arrangement as claimed in claim 1, wherein the at least one intermediate impedance transforming device is located on a gate terminal or input side of the transistor.

13. An arrangement as claimed in claim 1, wherein the at least one intermediate impedance transforming device is located on a drain terminal or output side of the transistor.

14. An arrangement as claimed in claim 1, wherein the at least one intermediate impedance transforming device is located on a gate terminal or input side of the transistor, and wherein the at least one intermediate impedance transforming device is located on a drain terminal or output side of the transistor.

15. An arrangement as claimed in claim 1, wherein the first end of the or each microwave transmission line is electrically connected to the transistor by a connection that is shorter in length than the microwave transmission line.

16. An arrangement as claimed in claim 1, wherein one end of the at least one intermediate impedance transforming device is substantially parallel to an input or output side of the transistor.

17. An arrangement as claimed in claim 1, wherein each of the plurality of the microwave transmission lines is coupled at the first end thereof to the microwave power transistor by means of a bond wire, the bond wire having a specified minimum practical length with an associated impedance, wherein the impedance of the bond wire is absorbed into the series impedance of the microwave transmission line.

18. An arrangement as claimed in claim 1, wherein the at least one intermediate impedance transforming device is mounted upside down in a 'flip-chip' manner with respect to the microwave power transistor and coupled at the first end thereof to the microwave power transistor by means of a solder bump.

19. An arrangement as claimed in claim 1, further including the primary matching network, the at least one dielectric substrate of the at least one intermediate impedance transforming device having a dielectric constant greater than the dielectric constant of the dielectric substrate of the primary matching network.

20. An arrangement as claimed in claim 1, wherein each microwave transmission line is bar-shaped.

21. A method of impedance matching to a microwave power transistor whereby a plurality of microwave transmission lines are connected at a first end thereof to a gate or drain terminal of the transistor and at a second end to a primary matching network including a first dielectric substrate having a dielectric constant, the microwave transmission lines being formed as evenly and regularly spaced conductive lines extending across or through a second dielectric substrate, the microwave transmission lines each having a predetermined series inductance and, in combination with an electrically isolated conductive plate or layer, a predetermined shunt capacitance such that each microwave transmission line together with the conductive plate or layer has a predetermined characteristic impedance and phase constant, the plurality of lines being arranged to transform the impedance between the transistor and the primary matching network, wherein the plurality of microwave transmission lines are formed extending along substantially the whole length of the second dielectric substrate and aligned with, and connected to, individual terminals of Field Effect Transistors (FETs).

22. A method according to claim 21, wherein the plurality of microwave transmission lines are connected at the first end thereof by means of bond wires to the gate or drain terminal of the transistor, wherein an impedance of the bond wires are absorbed into the series impedance of the microwave transmission lines to which they are connected.

23. A method according to claim 21, wherein each microwave transmission line is bar-shaped.

* * * * *